(12) United States Patent
Lin et al.

(10) Patent No.: US 9,085,696 B2
(45) Date of Patent: Jul. 21, 2015

(54) BLACK PHOTOSENSITIVE RESIN COMPOSITION AND LIGHT-BLOCKING LAYER USING THE SAME

(71) Applicant: Everlight USA, Inc., Pineville, NC (US)

(72) Inventors: Fan-Sen Lin, Taoyuan County (TW);
Hui-Huan Hsu, Taoyuan County (TW);
Bo-Nan Lin, Taoyuan County (TW);
Chih-Yi Chang, Taoyuan County (TW)

(73) Assignee: EVERLIGHT USA, INC., Pineville, NC (US)

( * ) Notice: Subject to any disclaimer, the term of this patent is extended or adjusted under 35 U.S.C. 154(b) by 162 days.

(21) Appl. No.: 13/859,875

(22) Filed: Apr. 10, 2013

(65) Prior Publication Data
US 2014/0100301 A1    Apr. 10, 2014

(30) Foreign Application Priority Data
Oct. 8, 2010  (TW) .............................. 101137077 A

(51) Int. Cl.
*C08L 83/04*  (2006.01)
(52) U.S. Cl.
CPC ..................................... *C08L 83/04* (2013.01)

(58) Field of Classification Search
USPC .............. 522/81, 74, 99, 148, 172, 113, 114, 522/120, 121, 150, 153, 178, 182
See application file for complete search history.

(56) References Cited

U.S. PATENT DOCUMENTS

2013/0135763 A1* 5/2013 Liao et al. ..................... 359/891
2013/0244177 A1* 9/2013 Tseng et al. ............... 430/280.1

FOREIGN PATENT DOCUMENTS

JP           2006058385 A    *  3/2006

* cited by examiner

*Primary Examiner* — Sanza McClendon
(74) *Attorney, Agent, or Firm* — Bacon & Thomas, PLLC

(57) ABSTRACT

The present invention provides a novel black photosensitive resin composition, which includes: a polysiloxane, a black pigment, an alkali-soluble resin, a photopolymerizable compound, a photopolymerization initiator and a solvent. Accordingly, the black photosensitive resin composition of the present invention can meet the requirements for optical density and resistance under high temperature and is advantageous to the application in a touch panel. In addition, the present invention further provides a light-blocking layer that is manufactured from the black photosensitive resin composition.

9 Claims, No Drawings

BLACK PHOTOSENSITIVE RESIN COMPOSITION AND LIGHT-BLOCKING LAYER USING THE SAME

CROSS REFERENCE TO RELATED APPLICATION

This application claims the benefits of the Taiwan Patent Application Serial Number 101137077, filed on Oct. 8, 2012, the subject matter of which is incorporated herein by reference.

BACKGROUND OF THE INVENTION

1. Field of the Invention

The present invention relates to a novel black photosensitive resin composition and a light-blocking layer using the same. More specifically, the present invention relates to a black photosensitive resin composition which is suitable for being applied to a touch panel and a light-blocking layer using the same.

2. Description of Related Art

In recent years, liquid crystal display (LCD) has been wildly applied to various kinds of electronic devices such as mobile phone, personal digital assistant (PDA), digital camera, computer screen or notebook computer screen. In particular, based on the consideration of easily carrying and using, a touch panel, which can be directly touched by users for operation, has become a major development aspect of many electronic products.

Generally, in order to improve a contrast or color purity of a display, a light-blocking film would be disposed in the LCD for preventing a light leakage phenomenon between pixels and maintaining high image quality. Usually, an inorganic film containing chrome black (chrome and/or chromium oxide) is used to prepare the light-blocking layer. However, not only is the high production cost of the light-blocking layer/film containing chrome black high, but it also has problems of environmental pollution. Thus, in related arts, the light-blocking layer/film has been prepared by using a resin composition including inorganic particles such as graphite, iron oxide black, titanium black, and carbon black. Among them, graphite may lead to a decrease in the contrast of a display due to an increase in reflectivity, and titanium black, although having a more preferred impedance, has the disadvantages of poor dispersion and high price. Therefore, the use of carbon black seems to be a better choice. However, when carbon black is used as black pigment, the increase of the optical density may cause the problem with decrease in the impedance of the black matrix, so that a short circuit would happen during the back-end layout process in a touch panel. On the other hand, because the impedance of the black matrix would be decreased under a high temperature environment, ITO short-circuit is caused by a high temperature of the back end process of the panel (reaching to 280° C). Therefore, in order to meet the requirement of the industry, there is a need for developing a black photosensitive resin composition that can satisfy the requirements of optical density and high temperature electrical resistance, and presents excellent adhesion, good moisture resistance and etching resistance.

SUMMARY OF THE INVENTION

The object of the present invention is to provide a novel black photosensitive resin composition that can be used to prepare a light-blocking layer which meets the requirements of optical density and high temperature electrical resistance and has desired characters such as excellent adhesion, moisture resistance and etching resistance, in order to facilitate applied to a touch panel.

To achieve the object, the black photosensitive resin composition of the present invention includes: (A) a polysiloxane; (B) a black pigment; (C) an alkali-soluble resin; (D) a photopolymerizable compound; (E) a photopolymerization initiator and (F) a solvent. Accordingly, in the present invention, through adding the polysiloxane, a black photoresist layer made of the black photosensitive resin composition may not only improve the optical density for presenting sufficient light-blocking property, but also still preserves high impedance during the backend high temperature process of touch panel. Accordingly, ITO short-circuit problem caused by the decrease in electrical impedance can be avoided, and the black photoresist layer is suitable for a backend process of the touch panel owing to its good adhesion, moisture resistance and etching resistance.

According to the present invention, the polysiloxane may be any siloxane polymer having Si—O bonds in its backbone or side chain without particularly limitation. For example, the polysiloxane may be a copolymer having siloxane side chain such as SB-500 and SB-355 (purchased from DIC Co., Ltd), which is used in specific embodiments of the present invention. Also, a copolymer having siloxane backbone may be selected and used as the polysiloxane included in the composition of the present invention. For example, in another specific embodiment of the present invention, a copolymer having siloxane backbone is synthesized by polymerizing a mixture of silane monomers. Preferably, the weight average of molecular weight (Mw) of the copolymer having siloxane backbone may be 500 to 3,000. Herein, the present invention may only add one kind of polysiloxane, or a mixture of two or more polysiloxanes, and the mixing ratio is not particularly limited. Preferably, the content of the polysiloxane may be 0.5 to 5.0 wt % based on the total weight of the black photosensitive resin composition.

According to the present invention, the mixture of the silane monomers mentioned above may preferably include a monomer as shown in the following formula (I'), and may selectively further include a monomer as shown in the following formula (II'),

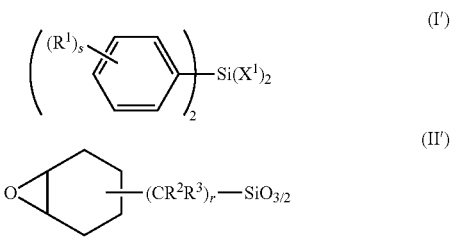

wherein the formula (I') monomer may be 35 to 75 mol % and formula (II') monomer may be 0 to 35 mol % based on the total moles of monomers in the mixture of silane monomers. For example, the mixture of silane monomers used in a preferred embodiment of the present invention may include about 50 to 60 mol % of the formula (I') monomer and 7 to 20 mol % of the formula (II') monomer in order to produce a copolymer having siloxane backbone. Thus, in the present invention, the copolymer having siloxane backbone may include a unit as shown in the following formula (I), and may selectively further include a unit as shown in the following formula (II),

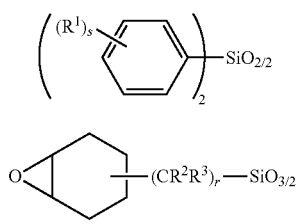

(I)

(II)

wherein $X^1$ and $X^2$ are each independently a reactive group for forming silicon-oxygen linkage between units (e. g. halogen, $C_{1-6}$ alkoxy group); $R^1$, $R^2$ and $R^3$ are each independently H or $C_{1-6}$ alkyl group; s is an integer of 0 to 5; and r is an integer of 1 to 6.

Furthermore, the above-mentioned mixture of silane monomers may further selectively include at least one of monomers shown in the following formulas (III') and (IV'),

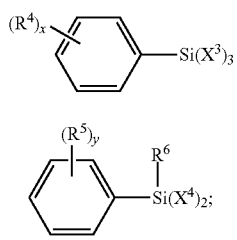

(III')

(IV')

wherein the formula (III') monomer may be 0 to 35 mol %, and formula (IV') monomer may be 0 to 50 mol % based on the total moles of monomer in the mixture of silane monomers. For example, the mixture of silane monomers used in a preferred embodiment of the present invention may further include about 10 to 20 mol % of the formula (III') monomer or 20 to 40 mol % of the formula (IV') monomer in order to produce a copolymer having siloxane backbone. Thus, in the present invention, the copolymer having siloxane backbone may further selectively include at least one of units as shown in the following formulas (III) and (IV),

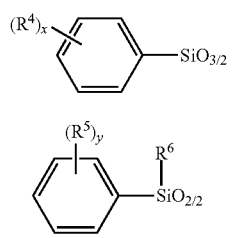

(III)

(IV)

wherein $X^3$ and $X^4$ are each independently a reactive group for forming silicon-oxygen linkage between the units (e.g. halogen, $C_{1-6}$ alkoxy group); $R^3$, $R^4$ and $R^5$ are each independently H or $C_{1-6}$ alkyl group; and x and y are each independently an integer of 0 to 5.

Also, the above-mentioned mixture of silane monomers may further selectively include a monomer as shown in the following formula (V'),

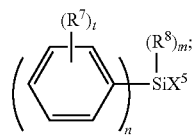

(V')

wherein the formula (V') monomer may preferably be 0 to 70 mol % based on the total moles of monomer in the mixture of silane monomers. More particularly, the mixture of silane monomers used in a preferred embodiment of the present invention may further include about 5 to 10 mol % of the formula (V') monomer in order to produce a copolymer having siloxane backbone. Thus, in the present invention, the copolymer having siloxane backbone may further selectively include a unit as shown in the following formula (V),

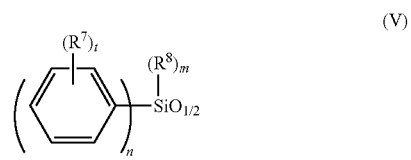

(V)

wherein $X^5$ is a reactive group for forming silicon-oxygen linkage between units (e.g. halogen, $C_{1-6}$ alkoxy group); $R^7$ and Ware each independently H or $C_{1-6}$ alkyl group; t is an integer of 0 to 5; m and n are each independently an integer of 1 to 3; and m+n is 3.

In the present invention, the black pigment may be an inorganic pigment, an organic pigment (e.g. azo-based pigment, C.I. pigment black 1, and C.I. pigment black 7) or a combination thereof without any particular limitation, but may preferably be an inorganic pigment. Examples of the inorganic pigment may include but are not limited to graphite, manganese dioxide, mars pigment, carbon black, copper-iron-manganese oxides, copper-chromium-manganese oxides, titanium black, titanium carbon, and the like. According to demand, only one kind of black pigment may be used, or a mixture including two or more black pigments may be used and the mixing ratio thereof is not particularly limited. According to a particular embodiment of the present invention, the black photosensitive resin composition of the present invention may preferably use carbon black as the black pigment such as EL-16 (commercial carbon black pigment, produced by SAKATA Co., Ltd). Herein, the content of the black pigment may preferably be 20 to 70 wt % based on the total weight of the black photosensitive resin composition, so that a formed black light-blocking layer may achieve a proper optical density and simultaneously maintain an appropriate electrical resistance.

In the present invention, the alkali-soluble resin may be a common alkali-soluble resin used in the art without any particular limitation, and it may preferably be an alkali-soluble acrylic resin. The content of the alkali-soluble resin preferably may be 1.0 to 30 wt % based on the total weight of the black photosensitive resin composition.

In the present invention, the photopolymerizable compound is not particularly limited as long as it can polymerize/crosslink with the alkali-soluble resin after absorbing a light energy. The photopolymerizable compound may be a common photopolymerizable compound used in the art, and it may preferably be a photopolymerizable compound including an ethylenically unsaturated group (e.g. multi-functional group monomer and/or oligomer). For example, the photopolymerizable compound including an ethylenically unsaturated group may include, but is not limited to, commercial Nikalac MX-302 (produced by Sanwa Chemical Co., Ltd.); Aronix M-400, M-402, M-403, M-404, M-408, M-450, M-305, M-309, M-310, M-313, M-315, M-320, M-325, M-326, M-327, M-350, M-360, M-208, M-210, M-215, M-220, M-225, M-233, M-240, M-245, M-260, M-270, M-1100, M-1200, M-1210, M-1310, M-1600, M-221, M-203, TO-924, TO-1270, TO-1231, TO-595, TO-756, TO-1343, TO-1382, TO-902, TO-904, TO-905, TO-1330 (produced by Toagosei Co., Ltd.); Kayarad D-310, D-330, DPHA, DPCA-20, DPCA-30, DPCA-60, DPCA-120, DN-0075, DN-2475, SR-295, SR-355, SR-399E, SR-494, SR-9041, SR-368, R-415, SR-444, SR-454, SR-492, SR-499, SR-502, SR-9020, SR-9035, SR-111, SR-212, SR-213, SR-230, SR-259, SR-268, SR-272, SR-344, SR-349, SR-368, SR-601, SR-602, SR-610, SR-9003, PET-30, T-1420, GPO-303, TC-1205, HDDA, NPGDA, TPGDA, PEG400DA, MANDA, HX-220, HX-620, R-551, R-712, R-167, R-526, R-551, R-712, R-604, R-684, TMPTA, THE-330, TPA-320, TPA-330, KS-HDDA, KS-TPGDA, KS-TMPTA (produced by Nippon Kayaku Co., Ltd.); Light Acrylate PE-4A, DPE-6A, DTMP-4A (produced by Kyoeisha Chemical Co., Ltd.); and a combination thereof. Herein, the content of the photopolymerizable compound may preferably be 0.5 to 10 wt % based on the total weight of the black photosensitive resin composition.

In the present invention, the photopolymerization initiator is not particularly limited as long as it can induce a free radical polymerization after absorbing a light energy. The photopolymerization initiator may be a common photopolymerization initiator used in the art. Particularly, the examples of the photopolymerization initiator may include, but are not limited to benzoin and its alkyl ether (e.g. benzoin, benzoin methyl ether, benzoin ethyl ether, benzoin isopropyl ether, benzoin phenyl ether, benzoin acetate), acetylbenzene (e.g. acetylbenzene, 2,2,-dimethoxy-2-phenylacetophenone, 2,2-diethoxyacetophenone, 1,1-dichloroacetophenone), aminoacetophenone (e.g. 2-methyl-4'-(methylthio)-2-morpholinopropiophen-1-one, 2-benzyl-2-(dimethylamino)-4'-morpholinobutyrophen-1-one), anthraquinone (e.g. 2-methylanthrapuinone, 2-ethylanthrapuinone, 2-tert-butylanthraquinone, 1-chloroanthraquinone, 2-amylanthraquinone), thioxanthone and xanthone (e.g. 2,4-dimethylthioxanthone, 2,4-diethylthioxanthone, 2-chlorothoxanthone, 2,4-diisopropylthioxanthone), ketal (e.g. acetophenone dimethylketal, benzyl dimethyl ketone), diphenylmethanone (e.g. diphenylmethanone, 4,4'-bis(N,N'-di-methyl-amino)benzophenone, 4,4'-bis(N,N'-di-ethyl-amino)benzophenone), acridine derivative, phenazine derivative, triphenylphosphine, phosphine oxide (e.g. (2,6-dimethoxybenzoyl)-2,4,4-pentyl phosphine oxide, bis(2,4,6-trimethylbenzoyl)-phenyl phosphine oxide, 2,4, 6-trimethylbenzoyl-diphenyl phosphine oxide, ethyl-2,4,6-trimethylbenzoyl-phenyl phosphinate, 1-phenyl-1,2-propanedione 2-O-benzoyl oxime), 1-[9-Ethyl-6-(2-methylbenzoyl)-9H-carbazol-3-yl]ethanone 1-(O-acetyloxime), 4-(2-hydroxyethoxy)Phenyl-(2-propyl)ketone, 1-aminophenyl ketone and 1-hydroxy phenyl ketone (e.g. 1-hydroxycyclohexyl phenyl ketone, 2-hydroxyisopropyl phenyl ketone, phenyl 1-hydroxyisopropyl ketone, 4-isopropylphenyl 1-hydroxyisopropyl ketone), 2,2'-azobis(isobutyronitrile), all kinds of peroxide, mercaptans, and a combination thereof. Herein, the content of the photopolymerization initiator may preferably be 0.5 to 5.0 wt % based on the total weight of the black photosensitive resin composition.

In the present invention, the solvent is not particularly limited as long as the solvent may disperse or dissolve each ingredient of the black photosensitive resin composition without reacting with the ingredients, and may have an appropriate volatility and drying rate. The solvent may be a common solvent used in the art. Particularly, the examples of the solvent may include, but are not limited to cyclohexanone, ethyl lactate, ethylene glycol monomethyl ether, ethylene glycol monomethyl ether acctate, methoxypropanol acetate, ethyl 3-ethoxypropionate, methyl ethylene glycol (MEDG) etc. According to the situation, only one kind of solvent may be used, or a mixture including two or more solvents may be used and the mixing ratio thereof is not particularly limited. Herein, the content of the solvent is a remaining content which is equal to the total amount of the black photosensitive resin composition excluding the content of other ingredients. For example, the content of the solvent may be 25 to 60 wt %.

The black photosensitive resin composition of the present invention may further include an additive depending on its need, and the particular examples thereof may include, but are not limited to a modifier, a toughener, a stabilizer, a defoamer, a dispersant, a leveling agent, a thickening agent, a reinforcing agent, a coupling agent, a flexibility-imparting agent, an adhesion promoter, an antioxidant, a flame retardant, a surfactant, a chain transfer agent, a curing agent, a colorant, a dye, an anti-settling etc., and a combination thereof The content of the additive may preferably be 10 wt % or less.

The black photosensitive resin composition of the present invention may not only have excellent developing ability, but also achieves desired characteristics such as no residues on a substrate, high adhesion, moisture resistance, and etching resistance etc. during patterning it for forming a black matrix. Especially, the black light-blocking layer formed by the black photosensitive resin composition of the present invention may not only improve the optical density for presenting sufficient light-blocking property, but also still preserves high impedance during the backend high temperature process of touch panel, so that ITO short-circuit problem caused by the decrease in electrical impedance can be avoid. Thereby, it is suitable to be used as a light-blocking layer in a touch panel.

According to another aspect, the present invention further provides a light-blocking layer, which is formed by the black photosensitive resin composition of the present invention. More particularly, the light-blocking layer formed by the black photosensitive resin composition of the present invention may be formed between pluralities of pixels of color filters for preventing light leakage between the pixels. Therefore, the present invention also relates to a color filter, which includes a light-blocking layer formed by the black photosensitive resin composition of the present invention. In addition, the black photosensitive resin composition of the present invention may be used in a liquid crystal display panel for providing a liquid crystal display panel including the light-blocking layer of the present invention; especially, a touch panel including the same. Herein, the optical density (OD) of the black photoresist layer/light-blocking layer may be more than 3.5, and its line resistance may be more than $1 \times 10^8$ above 290° C., even the line resistance may still preserve at $10^8$ under 300° C.

In summary, the present invention may increase the temperature of heat resistance from 270° C. to 290° C. by adding polysiloxane, so that the prepared light-blocking layer may not only exhibit improved optical density for presenting sufficient light-blocking property, but also still preserves high impedance during the backend high temperature process of touch panel for preventing ITO short-circuit problem caused by the decrease in resistance. Meanwhile, the light-blocking layer may have good adhesion, moisture resistance and etching resistance etc., and thus be suitable for a backend process of the touch panel. The present invention has excellent industrial competitiveness, in particular, can be applied to a one glass solution of touch panel.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. Other various aspects also may be practiced or applied in the invention, and various modifications and variations can be made without departing from the spirit of the invention based on various concepts and applications.

Without specific explanations, the unit of the parts and percentages used in the examples is calculated by weight.

A. Preparation of polysiloxane

SYNTHESIS EXAMPLES 1 to 3

The silane monomers as shown in the Table 1 are respectively added into three-necked bottles, and then a KOH solution (including 0.071 g of KOH and 16.63 g of $H_2O$) is respectively dropped into the three-necked bottles within 10 min. After that, the temperature of the reactants is increased to 50° C. for reacting 3 hours. Then, the temperature of the reactants is increased to 120-130° C. within 1 hour, and the mixture is distilled for 12 hours to produce polysiloxanes P1-P3.

B. Preparation of Black Photosensitive Resin Composition

<Embodiment 1>

0.99 parts by weight of polysiloxane P1 prepared in Example 1, 46 parts by weight of EL-16 (carbon black pigment, produced by SAKATA Co., Ltd.), 0.59 parts by weight of IRGACURE®I-242 (photopolymerization initiator, produced by BASF Co., Ltd.), 0.27 parts by weight of EAB (photopolymerization initiator, produced by Hodogaya Chemical Co., Ltd.), 2.07 parts by weight of Aronix M400 (photopolymerizable compound, produced by Toagosei Co., Ltd.), 3.96 parts by weight of EL-400 (alkali-soluble resin, synthesized by Everlight Chemical Co., Ltd.), 1.44 parts by weight of TMMP (produced by SAKAI CHEMICAL Co. Ltd.), 0.03 parts by weight of F-554 (produced by DIC Co., Ltd.), and 44.65 parts by weight of propylene glycol monomethyl ether acetate (PGMEA, solvent) are uniformly mixed to form 100 parts by weight of black photosensitive resin composition. Then, the solution are filtrated by a 2 μm filter in order to obtain a black photosensitive resin composition A.

<Embodiments 2-3>

The processes for preparing the black photosensitive resin compositions B and C of the Embodiments 2 and 3 are the

TABLE 1

| polysiloxane | Synthesis Example 1 P1 | Synthesis Example 2 P2 | Synthesis Example 3 P3 |
|---|---|---|---|
| methoxytrimethylsilane (Me-Si(O-Me)(Me)(Me)) | 2.5 g (9.25 mol %) | 2.5 g (9.08 mol %) | 2.5 g (8.81 mol %) |
| diphenyldimethoxysilane, DPDMS (MeO-Si(Ph)(Ph)-OMe) | 35.54 g (56.05 mol %) | 35.54 g (54.99 mol %) | 35.54 g (53.38 mol %) |
| phenyltrimethoxysilane (MeO-Si(Ph)(OMe)-OMe) | 10 g (19.28 mol %) | — | — |
| (A-186) epoxycyclohexyl-ethyl-trimethoxysilane | 10 g (15.42 mol %) | 10 g (15.13 mol %) | 5 g (7.34 mol %) |
| (CB-638PM) (MeO-Si(Ph)(Me)-OMe) | — | 10 g (20.80 mol %) | 15 g (30.47 mol %) |
| Solid Content | 99.80% | 99.87% | 99.65% |
| weight average of molecular weight (Mw) | 1428 | 1535 | 2233 |
| polydispersity index (PDI) | 1.41 | 1.41 | 1.35 | same as that described in Embodiment 1, except that the polysiloxane P1 is respectively substituted with the polysiloxanes P2 and P3 prepared in Embodiments 2 and 3.

<Embodiments 4-5>

The processes for preparing the black photosensitive resin compositions D and E of the Embodiments 4 and 5 are the same as that described in Embodiment 1, except that the polysiloxane P1 is respectively substituted with SB-500 (P4) and SB-355 (P5) (purchased from DIC Co., Ltd.).

<Comparative Embodiment 1>

The processes for preparing the black photosensitive resin composition F of the Comparative embodiment 1 is the same as that described in Embodiment 1, except that there is no polysiloxane thereof <Comparative Embodiments 2-5>

The processes for preparing the black photosensitive resin compositions G to J of the Comparative embodiments 2 to 5 are the same as that described in Embodiment 1, except that the polysiloxane P1 is respectively substituted with A-187, A-174, A-186 and DPDMS, wherein the chemical structures thereof are shown below.

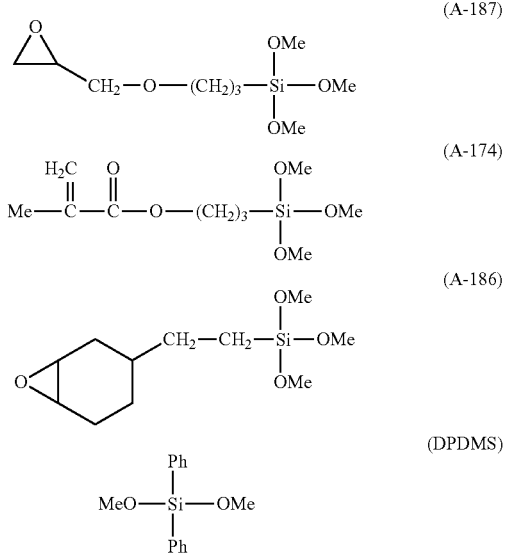

C. Testing for Characteristics of Black Photoresist

The black photosensitive resin compositions of the above-mentioned embodiments and comparative embodiments are respectively coated on glass substrates by spin coating, and are pre-baked for 5 min at 80° C. Then, the resin compositions are exposed by ultra-high pressure mercury lamp (exposure energy: 200 mJ/cm$^2$). After that, the samples are developed by 0.04% KOH developer for 60 sec. Then, the samples were post-baked for 30 min at 230° C. in order to prepare samples having black photoresist (thickness: about 1.0 µm).

In order to estimate the characteristics of the black photoresist layer formed by the black photosensitive resin composition, the black photoresist layer formed on the substrate is measured its OD, thermal resistance, moisture resistance, and etching resistance according following methods. The results are shown in Table 2.

<Optical Density>

The optical density (OD) of 1.0 µm of the black photoresist is measured by using an optical density meter.

<Line Resistance>

The samples are respectively baked in an oven for 20 min with different temperatures. Then, two conductive tapes are stuck on the surface of the samples in 1 mm interval, and the resistance value between two tapes is measured by Fluke 287 Multimeter.

<Moisture Resistance>

(a) Water-bath: the samples are disposed into water at 80° C. for 60 min, and then the adhesion of the black photoresist to the STN glass is tested by cross hatch cutter and 3M tape (ASTM3359 testing method).

(b) P.C.T (pressure cook test): the samples are placed in a state (121° C. and 2 atm) for 24 hours, and then the adhesion of the black photoresist to the STN glass is tested by cross hatch cutter and 3M tape (ASTM3359 testing method).

<Etching Resistance>

The samples are disposed into 10% of aqua regia at 40° C. for about 2 min, and then the adhesion of the black photoresist to the ITO glass is tested by cross hatch cutter and 3M tape (ASTM3359 testing method).

TABLE 2

|  |  | Embodiment 1 | Embodiment 2 | Embodiment 3 | Embodiment 4 | Embodiment 5 |
|---|---|---|---|---|---|---|
| black photosensitive resin composition |  | A | B | C | D | E |
| Polysiloxane |  | P1 | P2 | P3 | P4 | P5 |
| 1 µm OD |  | 3.61 | 3.60 | 3.59 | 3.68 | 3.61 |
| Line reisistance (Ω/cm) | 260° C. | >10$^8$ | >10$^8$ | >10$^8$ | >10$^8$ | >10$^8$ |
|  | 270° C. | >10$^8$ | >10$^8$ | >10$^8$ | >10$^8$ | >10$^8$ |
|  | 280° C. | >10$^8$ | >10$^8$ | >10$^8$ | >10$^8$ | >10$^8$ |
|  | 290° C. | >10$^8$ | >10$^8$ | >10$^8$ | >10$^8$ | >10$^8$ |
|  | 300° C. | 10$^8$ | 10$^8$ | 10$^8$ | 10$^8$ | 10$^8$ |
| Moisture resistance (STN) | Water-bath | 5B | 5B | 5B | 5B | 5B |
|  | PCT | 5B | 5B | 4B | 5B | 4B |
| Etching resistance (ITO) |  | 5B | 4B | 5B | 5B | 5B |

TABLE 3

|  |  | Comparative embodiment 1 | Comparative embodiment 2 | Comparative embodiment 3 | Comparative embodiment 4 | Comparative embodiment 5 |
|---|---|---|---|---|---|---|
| black photosensitive resin composition |  | F | G | H | I | J |
| silane |  | — | A-187 | A-174 | A-186 | DPDMS |
| 1 µM OD |  | 3.68 | 3.67 | 3.63 | 3.62 | 3.64 |
| Line resistance (Ω/cm) | 260° C. | >10$^8$ | >10$^8$ | >10$^8$ | >10$^8$ | >10$^8$ |
|  | 270° C. | 10$^7$ | >10$^8$ | >10$^8$ | >10$^8$ | >10$^8$ |
|  | 280° C. | 10$^7$ | 10$^8$ | 10$^8$ | 10$^8$ | 10$^8$ |
|  | 290° C. | 10$^7$ | 10$^8$ | 10$^8$ | 10$^8$ | 10$^8$ |
|  | 300° C. | 10$^6$ | 10$^6$ | 10$^6$ | 10$^6$ | 10$^6$ |

TABLE 3-continued

| | | Comparative embodiment 1 | Comparative embodiment 2 | Comparative embodiment 3 | Comparative embodiment 4 | Comparative embodiment 5 |
|---|---|---|---|---|---|---|
| Moisture resistance (STN) | Water-bath | 5B | 5B | 5B | 5B | 5B |
| | PCT | 5B | 5B | 5B | 5B | 4B |
| Etching resistance (ITO) | | 5B | 5B | 4B | 5B | 4B |

According to the above-mentioned results, comparing with the comparative embodiments, the black photoresist layer made of the black photosensitive resin composition of the present invention not only can achieve OD value of 3.5 or more, but also can meet the requirement of high temperature resistance (line resistance >1×10⁸ over 290° C., even if the line resistance can still be 10⁸ under 300° C.). Moreover, the black photoresist layer presents an excellent adhesion, a moisture resistance, and an etching resistance, so that it is suitable to be used as a light-blocking layer in a touch panel.

In addition, the black photosensitive resin composition obtained from Embodiments 1 to 5 are uniformly coated on glass substrates by spin coating, and then being patterned in order to observe the patterned black photoresist. As results, the black photosensitive resin composition of the present invention shows excellent characters such as good linearity, no residues on a substrate and high resolution, so that it could be suitable to be formed a black matrix in a liquid crystal display panel.

D. Other Embodiments of Black Photosensitive Resin Composition

Black photosensitive resin compositions of other Embodiments are prepared according to each content of component (parts by weight) shown in Table 4, and then are respectively treated with the above-mentioned steps such as coating, exposure and development in order to measure OD value, thermal resistance, moisture resistance, etching resistance etc. As results, all samples show the OD values over 3.5, the line resistances 1×10⁸ over 290° C., good developing linearity, no residues on a substrate, excellent moisture resistance and etching resistance.

TABLE 4

| | Embodiment 6 | Embodiment 7 | Embodiment 8 | Embodiment 9 |
|---|---|---|---|---|
| P1 | — | — | 2.5 | — |
| P2 | 0.5 | — | — | — |
| P3 | 1.0 | — | — | — |
| P4 | — | 0.5 | — | 5.0 |
| P5 | — | 0.5 | — | — |
| EL-16 | 46 | 46 | 46 | 46 |
| I-242 | 0.58 | 0.61 | 0.77 | 0.75 |
| EAB | 0.25 | 0.29 | 0.35 | 0.39 |
| M400 | 2.05 | 1.95 | 1.54 | 0.58 |
| TMMP | 1.45 | 1.47 | 1.48 | 1.45 |
| EL-400 | 3.52 | 4.03 | 2.71 | 1.18 |
| F-554 | 0.05 | 0.05 | 0.05 | 0.05 |
| PGMEA | 44.6 | 44.6 | 44.6 | 44.6 |

Although the present invention has been explained in relation to its preferred embodiment, it is to be understood that many other possible modifications and variations can be made without departing from the spirit and scope of the invention as hereinafter claimed.

What is claimed is:

1. A black photosensitive resin composition, which includes:
   (A) 0.5-5.0 wt % of a polysiloxane;
   (B) 20-70 wt % of a black pigment;
   (C) 1.0-30 wt % of an alkali-soluble resin;
   (D) 0.5-10 wt % of a photopolymerizable compound;
   (E) 0.5-5.0 wt % of a photopolymerization initiator; and
   (F) a solvent as the remainder;
   wherein the polysiloxane is a copolymer having a siloxane backbone, and the copolymer having a siloxane backbone includes the following formula (I) unit and formula (II) unit:

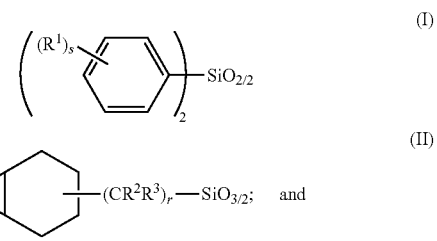

wherein $R^1$, $R^2$ and $R^3$ are each independently H or $C_{1-6}$ alkyl group; s is an integer of 0 to 5; and r is an integer of 1 to 6.

2. The black photosensitive resin composition of claim 1, wherein the copolymer having a siloxane backbone further includes at least of following formula (III) unit and formula (IV) unit:

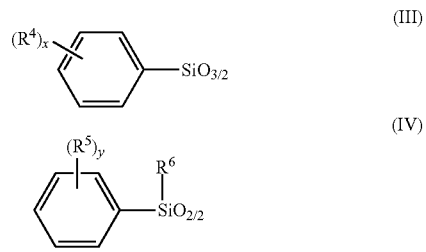

wherein $R^4$, $R^5$ and $R^6$ are each independently H or $C_{1-6}$ alkyl group; and x and y are each independently an integer of 0 to 5.

3. The black photosensitive resin composition of claim 2, wherein the copolymer having a siloxane backbone further includes a formula (V) unit:

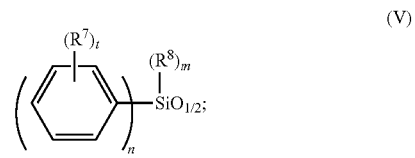

wherein $R^7$ and $R^8$ are each independently H or C1-6 alkyl group; t is an integer of 0 to 5; m and n are each independently an integer of 1 to 3; and m+n is 3.

4. The black photosensitive resin composition of claim 1, wherein the copolymer having a siloxane backbone has a weight average molecular weight of 500 to 3,000.

5. The black photosensitive resin composition of claim 1, wherein the photopolymerizable compound includes an ethylenically unsaturated group.

6. The black photosensitive resin composition of claim 1, wherein the alkali-soluble resin is an alkali-soluble acrylic resin.

7. The black photosensitive resin composition claim 1, wherein the black pigment is using carbon black.

8. The black photosensitive resin composition of claim 1, wherein the black photosensitive resin composition is used to form a light-blocking layer in a touch panel.

9. A light-blocking layer, which is formed by the black photosensitive resin composition of claim 1.

* * * * *

UNITED STATES PATENT AND TRADEMARK OFFICE
CERTIFICATE OF CORRECTION

PATENT NO. : 9,085,696 B2  
APPLICATION NO. : 13/859875  
DATED : July 21, 2015  
INVENTOR(S) : Fan-Sen Lin et al.

Page 1 of 1

It is certified that error appears in the above-identified patent and that said Letters Patent is hereby corrected as shown below:

On the Title Page of the Patent:

"(30)   Foreign Application Priority Data

Oct. 8, 2010    (TW) ............................... 101137077 A"

should read:

--(30)   Foreign Application Priority Data

Oct. 8, 2012    (TW) ............................... 101137077 A--

Signed and Sealed this  
Sixteenth Day of February, 2016

Michelle K. Lee  
*Director of the United States Patent and Trademark Office*